(12) United States Patent
Dutta et al.

(10) Patent No.: US 12,363,913 B2
(45) Date of Patent: Jul. 15, 2025

(54) FABRICATION OF EMBEDDED MEMORY DEVICES UTILIZING A SELF ASSEMBLED MONOLAYER

(71) Applicant: International Business Machines Corporation, Armonk, NY (US)

(72) Inventors: Ashim Dutta, Menands, NY (US); Ekmini Anuja De Silva, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 18/351,605

(22) Filed: Jul. 13, 2023

(65) Prior Publication Data

US 2023/0363179 A1 Nov. 9, 2023

Related U.S. Application Data

(62) Division of application No. 16/382,519, filed on Apr. 12, 2019, now Pat. No. 11,744,083.

(51) Int. Cl.
| | |
|---|---|
| *H10B 61/00* | (2023.01) |
| *H01L 23/532* | (2006.01) |
| *H10N 50/01* | (2023.01) |
| *H10N 50/10* | (2023.01) |
| *H10N 50/80* | (2023.01) |

(52) U.S. Cl.
CPC ....... *H10B 61/00* (2023.02); *H01L 23/53209* (2013.01); *H10N 50/01* (2023.02); *H10N 50/10* (2023.02); *H10N 50/80* (2023.02)

(58) Field of Classification Search
CPC .. H10B 61/00; H01L 23/53209; H10N 50/01; H10N 50/10; H10N 50/80
See application file for complete search history.

(56) References Cited

U.S. PATENT DOCUMENTS

| | | | |
|---|---|---|---|
| 6,783,995 B2 | 8/2004 | Hineman | |
| 8,455,267 B2 * | 6/2013 | Li | H10N 50/01 |
| | | | 257/E21.665 |
| 8,962,349 B1 | 2/2015 | Chen | |
| (Continued) | | | |

FOREIGN PATENT DOCUMENTS

| | | | |
|---|---|---|---|
| JP | 2003258207 A | * | 9/2003 |
| WO | 2017160311 | | 9/2017 |
| WO | 2018195408 A1 | | 10/2018 |

*Primary Examiner* — Ermias T Woldegeorgis
(74) *Attorney, Agent, or Firm* — L. Jeffrey Kelly

(57) ABSTRACT

A semiconductor device structure includes a metallization stack comprising one or more patterned metal layers. A bi-layer dielectric cap is disposed on and in contact with the metallization stack. At least one memory device is disposed on the bi-layer dielectric cap. A method for forming the metallization stack includes receiving a structure comprising a metallization layer and a first dielectric cap layer formed over the metallization layer. The metallization layer includes a logic area and a memory area. At least one memory stack is formed over the first dielectric cap layer. A self-assembled monolayer is formed over and in contact with the memory stack. A second dielectric cap layer is formed on and in contact with the first dielectric cap layer. The second dielectric cap layer is not formed on the self-assembled monolayer.

8 Claims, 11 Drawing Sheets

(56) References Cited

U.S. PATENT DOCUMENTS

| | | |
|---|---|---|
| 9,159,907 B2 | 10/2015 | Tang |
| 9,166,155 B2 | 10/2015 | Deshpande |
| 9,306,157 B2 | 4/2016 | Deshpande |
| 9,564,582 B2 | 2/2017 | Pakala |
| 9,806,252 B2 | 10/2017 | Tan |
| 9,837,603 B1 | 12/2017 | Deshpande |
| 9,935,261 B1 | 4/2018 | Patel |
| 10,026,887 B2 | 7/2018 | Ekerdt |
| 10,043,657 B2 | 8/2018 | Swaminathan |
| 11,744,083 B2 | 8/2023 | Dutta |
| 2005/0276099 A1 * | 12/2005 | Horng .................. H10N 50/01 365/158 |
| 2013/0082339 A1 | 4/2013 | Aggarwal |
| 2015/0217330 A1 | 8/2015 | Haukka |
| 2015/0255507 A1 | 9/2015 | Pakala |
| 2015/0380640 A1 | 12/2015 | Deshpande |
| 2016/0049581 A1 | 2/2016 | Kim et al. |
| 2016/0126454 A1 | 5/2016 | Mudivarthi |
| 2016/0268336 A1 | 9/2016 | Shum et al. |
| 2017/0263675 A1 | 9/2017 | Park |
| 2017/0294569 A1 | 10/2017 | Chen |
| 2018/0019387 A1 | 1/2018 | Tan |
| 2018/0182809 A1 | 6/2018 | Liu |
| 2018/0197915 A1 | 7/2018 | Briggs |
| 2018/0240967 A1 | 8/2018 | Gaidis |
| 2019/0013354 A1 | 1/2019 | Lee et al. |
| 2020/0006634 A1 | 1/2020 | Brockman et al. |

* cited by examiner

FABRICATION OF EMBEDDED MEMORY DEVICES UTILIZING A SELF ASSEMBLED MONOLAYER

BACKGROUND OF THE INVENTION

The present invention generally relates to the field of semiconductors, and more particularly relates to fabricating embedded memory devices using one or more self-assembled monolayers.

Memory devices are often embedded or integrated on-chip to realize various advantages such as reduced chip number, increased response times, etc. Embedded memory devices may utilize technologies such as magnetic tunnel junctions, phase change materials, and/or the like. Components of the embedded memory devices are often susceptible to damage during subsequent processing and integration operations. For example, during etching of the magnetic tunnel junction stack significant damage to or removal of the dielectric layer under the bottom electrode may occur. This may result in exposed and contaminated lines within the interconnect level.

SUMMARY OF THE INVENTION

In one embodiment, a method for forming an embedded memory device comprises receiving a structure comprising a metallization layer and a first dielectric cap layer formed over the metallization layer. The metallization layer comprises a logic area and a memory area. At least one memory stack is formed over the first dielectric cap layer. A self-assembled monolayer is formed over and in contact with the memory stack. A second dielectric cap layer is formed on and in contact with the first dielectric cap layer. The second dielectric cap layer is not formed on the self-assembled monolayer.

In another embodiment, a semiconductor device structure comprises one or more patterned metal layers. A bi-layer dielectric cap is disposed on and in contact with the metallization stack. At least one memory device is disposed on the bi-layer dielectric cap.

In further embodiment, a semiconductor device structure comprises a metallization stack having at least a first patterned metal layer in a memory area and at least a second patterned metal layer in a logic area. A bi-layer dielectric cap is disposed on and in contact with the metallization stack. At least one memory device is disposed on the bi-layer dielectric cap.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
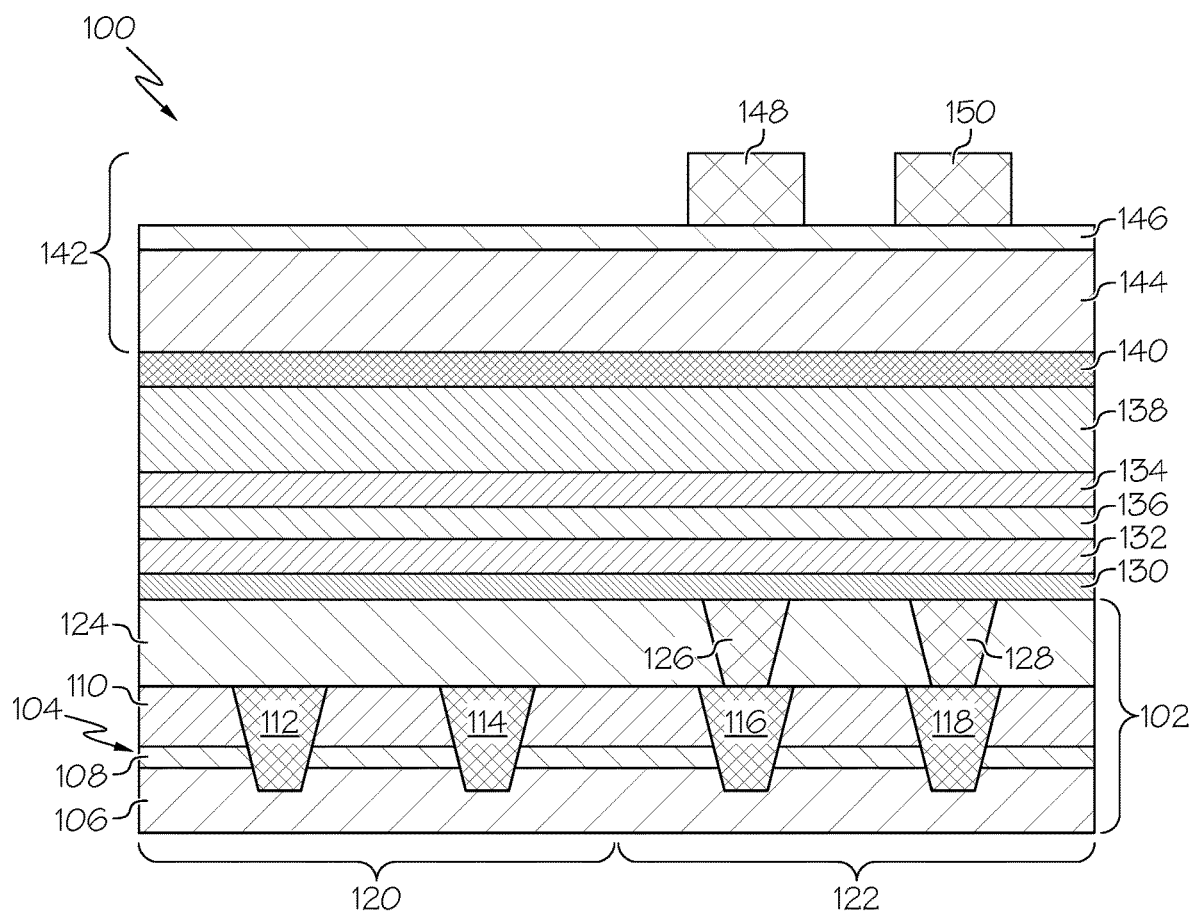
FIG. 1 is a cross-sectional view of a semiconductor device structure after a patterning mask has been formed over a stack of magnetic tunnel junction layers according to one embodiment of the present invention.

It is to be understood that embodiments of the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDS II) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

FIGS. 1-10 illustrate various processes for fabricating embedded memory devices according to one or more embodiments of the present invention. Referring now to FIG. 1, a semiconductor structure 100 is illustrated at point in time of the fabrication process after memory device layers and a patterning mask have been formed. In this example, the structure 100 comprises a metallization material stack 102 that includes one or more layers. A first or bottom portion 104 of the stack 102 may be disposed directly on a semiconductor stack. The bottom portion 104 of the stack 102 may be comprised of one or more layers including a first layer 106, a second layer 108, a third layer 110, etc. The first layer 106 may comprise an oxide, moderate-k or low-k dielectric, and/or the like. The second layer 108 may be disposed on and in contact with the first layer 106 and may comprise a capping material such as silicon carbide, hydrogen and nitrogen doped silicon carbide, silicon nitride, and/or the like. The third layer 110 may be disposed on and in contract with the second layer 108 and comprise an insulating material such as a low-k dielectric, ultra-low-k dielectric, and/or the like. It should be noted that embodiments are not limited to the layers of the bottom portion 104 of the stack 102 shown in FIG. 1 as additional layers may be added and/or one or more layers may be removed.

The bottom portion 104 of the stack 102 may comprise patterned metal layers 112 to 118 embedded therein. In the example shown in FIG. 1, the patterned metal layers 112 to 118 are embedded within the first layer 106, second layer 108, and third layer 110 of the bottom portion 104 of the stack 102. The patterned metal layers 112 to 118, in one example, are metallization contacts comprising, tungsten, copper, cobalt, and/or the like. At least a first set of patterned metal layers 112, 114 is disposed within a logic area 120 of the structure while at least a second set of patterned metal layers 116, 118 is disposed within a memory area 122 of the structure 100.

A second or top portion 124 of the metallization stack 102 may be disposed on the bottom portion 104 of the metallization stack 102. In one example, the top portion 124 of the metallization stack 102 comprises one or more dielectric materials such as silicon carbonitride (SiCN:H), silicon carbide, hydrogen and nitrogen doped silicon carbide, silicon nitride, and/or the like. Accordingly, at least in some embodiments, the top portion 124 of the metallization stack 102 may also be referred to as "the first dielectric cap layer 124". It should be noted that while the metallization material stack 102 may include the top portion 124 disposed directly on the bottom portion 104, in various embodiments the metallization material stack 102 may include one or more intervening metallization layers between the bottom and top portions 102, 124. That is, the top portion 124 of the metallization stack 102 would be disposed on one or more intervening metallization layers, or other material layers, which would be disposed on the bottom portion 104 of the metallization stack 102.

In some examples, a dielectric insulating layer (not shown) may separate the second metallization layer 108 from the first metallization layer 106. This dielectric insulating layer may be used to separate at least some metal wiring, circuits, and junctions, in the second metallization layer 108 from making direct electrical contact with metal wiring, circuits, and junctions, in the first metallization layer 106. The dielectric insulating layer may be removed at selected locations to allow electrical interconnection, e.g., wiring and junctions, to extend from the second metallization layer 108 down to the first metallization layer 106, and/or further below to a semiconductor stack (not shown). The dielectric insulating layer may include, for example, dielectric material such as silicon oxide or carbon-doped oxide, or other low K dielectrics.

In one example, the top portion 124 of the metallization stack 102 comprises one or more electrode contacts 126, 128 (also referred to herein as "bottom electrode contacts 126, 128") within the memory area 122. In this example, the top surface of the bottom electrode contact 126, 128 is planar with a top surface of top portion 124 of the metallization stack 102 and a bottom surface of the electrode contacts 126, 128 contacts a top surface of the patterned metal layer 116, 118 within the memory area 122. The bottom electrode contact 126, 128 may comprise metals such as (but not limited to) copper (Cu), tungsten (W), aluminum (Al), etc. In one embodiment, the bottom electrode contacts 126, 128 may be formed using a damascene process where metal is deposited inside the trench having sidewall liners like such as (but not limited to) titanium nitride (TiN), tantalum nitride (TaN), ruthenium (Ru), etc. In another embodiment, the bottom electrode contacts 126, 128 may be formed using a subtractive etch process.

FIG. 1 further shows that a first electrode layer 130 (also referred to herein as "bottom electrode layer 130") is formed on and in contact with the bottom electrode contact 126, 128 and the second metallization layer 104. The bottom electrode layer 130 may comprise materials such as (but not limited to) W, WN, Al, TaN, TiN, etc. MTJ stack layers 132 to 136 may then be formed on the bottom electrode layer 130. The MTJ layers comprises two magnetic layers 132, 134 that are separated by an insulating layer 136 referred to as a tunnel barrier. The first magnetic layer 132 is formed on and in contact with the bottom electrode layer 130. The insulating layer 136 is then deposited over and in contact with the first magnetic layer 133. The second magnetic layer 134 is then deposited over and in contact with the insulating layer 136.

The first and second magnetic layers 132, 134 may comprise a magnetic material such as, but not limited to, cobalt (Co), iron (Fe), boron (Ba, CoFeB alloys, Co/Pt multilayers, Co/Ni multilayers, similar ferromagnetic multilayer materials or alloys with transition metals or rare earth metals, any combination thereof, and/or the like. The insulating layer 136 may comprise materials such as, but not limited to, magnesium oxide (MgO), aluminum oxide (AlOx), and/or the like. It should be noted that additional barrier layers (not shown) may also be formed/deposited as part of the MTJ stack as well.

One of the magnetic layers 132, 134 has a high level of magnetization and is fixed/pinned (reference layer). The other magnetic layer 132, 134 has a lower amount of magnetization and is referred to as the free layer (i.e., not pinned). The free layer is able to rotate its magnetization to be parallel with the pinned layer or anti-parallel to the pinned layer. Parallel magnetizations allow current to tunnel through the tunnel barrier resulting in low resistance. Anti-parallel magnetizations do not allow current to tunnel through the tunnel barrier resulting in high resistance. The magnetizations can be controlled either by passing current through a different copper line so that the current induces a magnetic field that interacts with the free layer or by directly injecting spin polarized current into the device which produces a torque on the magnetic free layer.

FIG. 1 further shows a second electrode layer 138 (also referred to herein as "top electrode layer 138") is formed on and in contact with the top-most layer of the MTJ stack layers 132 to 136. For example, the top electrode layer 138 may be formed on and in contact with the second magnetic layer 134. The top electrode layer 138 may comprise tantalum nitride (TaN), tungsten (W), tantalum (Ta), aluminum (Al), hafnium (Hf), titanium nitride (TiN), copper (Cu), cobalt (Co), and/or the like.

After the top electrode layer 138 has been formed a dielectric hardmask layer 140 may be formed thereon. The hardmask layer 140 may comprise a material such as (but not limited to) silicon nitride, silicon oxide, or a dielectric metal oxide, and/or the like. A patterning stack 142 may be formed over the hardmask layer 140. The patterning stack 142 may be a tri-layer stack, quad-layer stack, or any other applicable patterning stack configuration. In the example shown in FIG. 1, the patterning stack 142 comprises an organic planarization layer (OPL) 144, an anti-reflective coating (ARC) 146, and a photoresist layer 148. The OPL 144 may include a material(s) such as spin-on carbon (SOC), diamond-like carbon, polyarylene ether, polyimide, polymethacrylate, polymethylisopropenyl ketone, photoresists, and/or the like. The OPL 144 may be formed utilizing any conventional deposition process including, for example, CVD, PVD, plasma enhanced chemical vapor deposition (PECVD), evaporation, spin coating, and dip coating. Chemical mechanical planarization (CMP) and/or grinding may be used to planarize the deposited OPL.

The ARC layer 146 may comprise a silicon-ARC, titanium-ARC, and/or the like. The ARC layer 146 may be formed by, for example, one or more processes including sputtering, evaporation, CVD, PVD, ALD, and/or the like. The photoresist layer 148, 150 (shown as being patterned) may comprise a material that is sensitive to one or more types of patterning processes such extreme ultraviolet (EUV) light patterning and/or the like. The photoresist layer 148, 150 may be deposited using one or more processes such as CVD, PVD, ALD, and/or the like.

The photoresist layer 148, 150 may be patterned using any suitable photolithography technique. For example, in on embodiment, a photomask is disposed over the photoresist layer 148, 150. The photoresist layer 148, 150 may then be exposed to a radiation beam, and then hardened via a curing or baking process. Unexposed or exposed portions of the photoresist layer may then be removed using a developer. The foregoing process results in the desired pattern. The pattern includes portions of the photoresist layer 148, 150 in contact with ARC layer 146 while other portions of the ARC layer 146 remain exposed. In some embodiments, the portions of the photoresist layer 148, 150 may be trimmed using, for example, an anisotropic plasma etch process.

Figure 2:
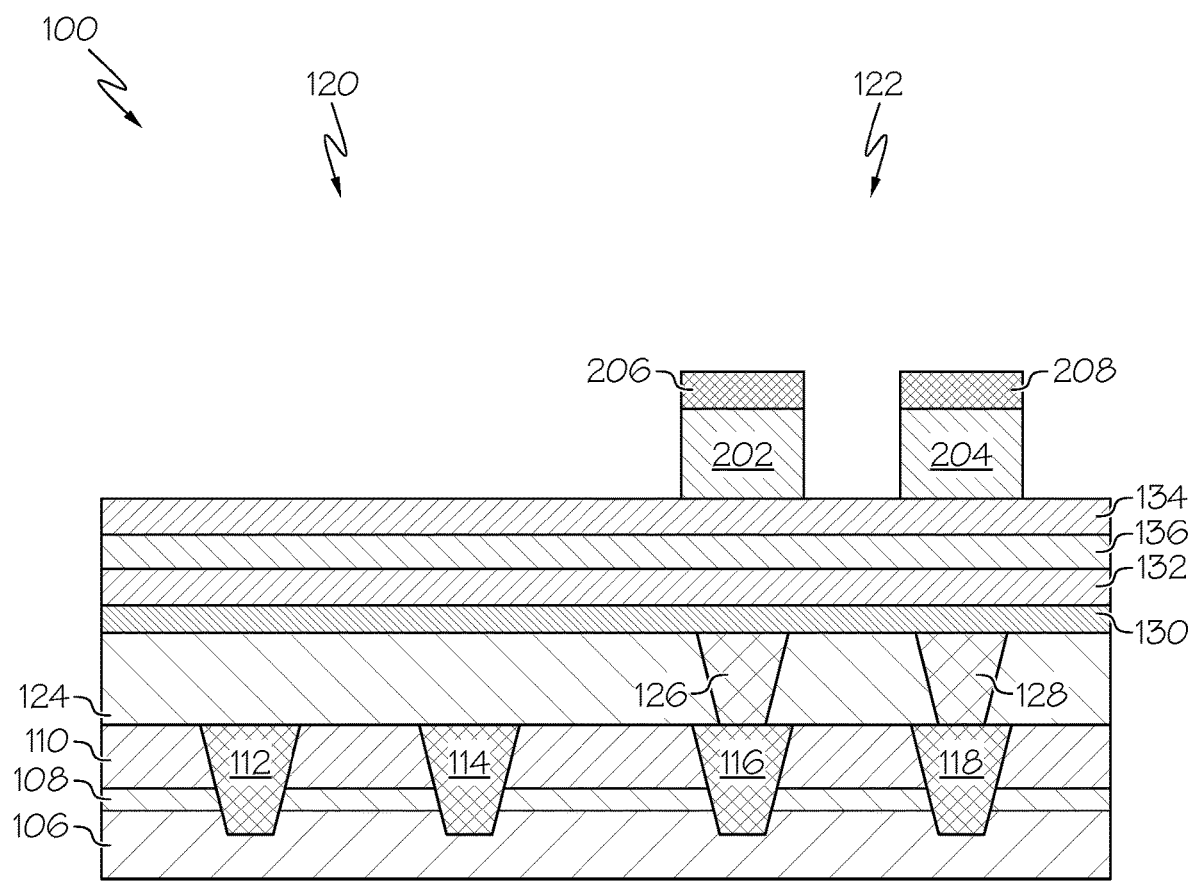
FIG. 2 is a cross-sectional view of the semiconductor device structure after top electrodes have been patterned according to one embodiment of the present invention.

After the photoresist layer 148, 150 has been patterned, the pattern is transferred down to the top electrode layer 138, as shown in FIG. 2. For example, a selective etching process may be used to first transfer the pattern to the ARC layer 146. A separate selective etching process may then be used to transfer the pattern to the OPL 144. Alternatively, the ARC layer 146 and the OPL 144 may be etched using a single etching process. One or more etching processes may then be used to transfer the pattern down to each hardmask layer 140 and then down to the top electrode layer 138. The etching process, in one embodiment, stops on the MTJ stack layers 132 to 136. Any remaining photoresist layer 148, 150; ARC layer 146, and OPL 144 may be removed by, for example, reactive ion etches (RIE). The patterning process forms a first top electrode 202 over a first patterned metal layer 116 and a second top electrode 204 over a second pattern metal layer 118 within the memory area 122 of the structure 100. The patterning process further forms a first hardmask 206 on and in contact with the first top electrode 202 and a second hardmask 208 on and in contact with the second top electrode 204.

Figure 3:
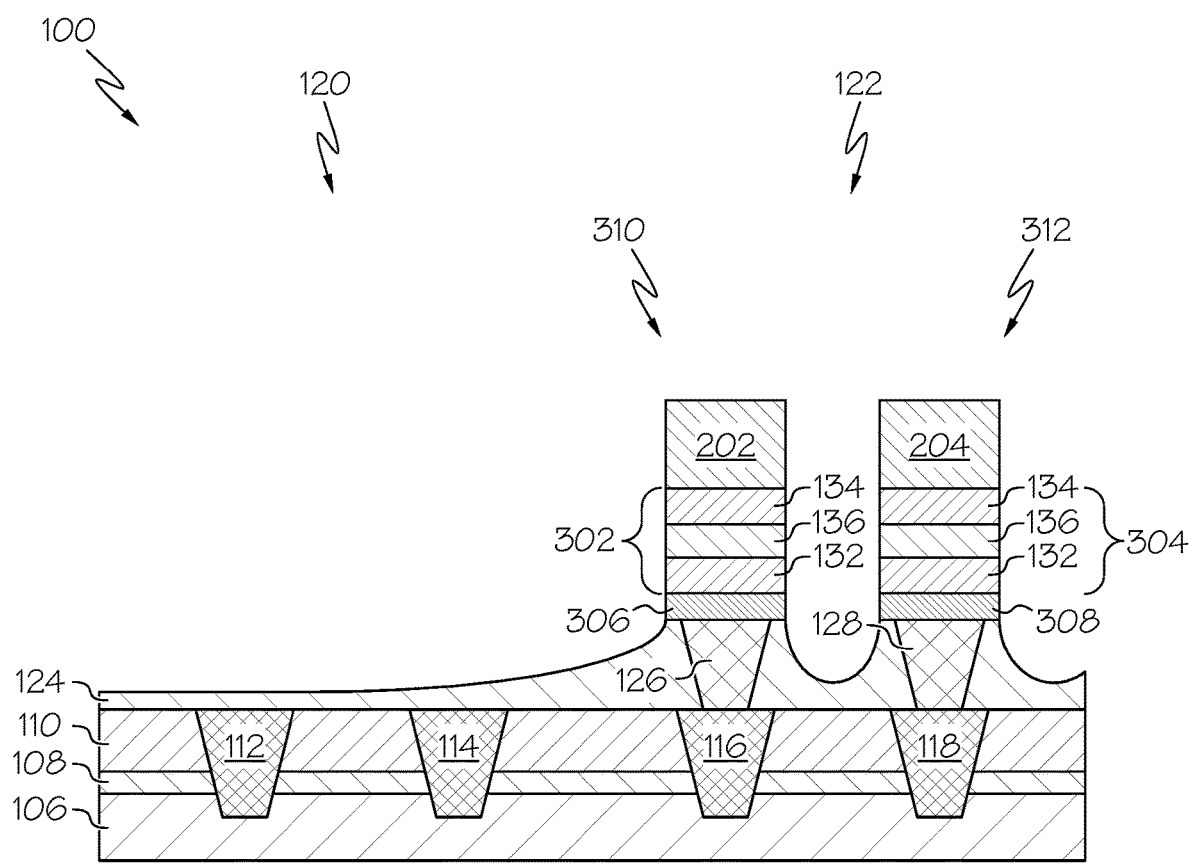
FIG. 3 is a cross-sectional view of the semiconductor device structure after magnetic tunnel junction stacks and bottom electrodes have been patterned according to one embodiment of the present invention.

FIG. 3 shows that one or more additional etching processes such as ion beam etching (IBE) is then performed to pattern the MTJ stack layers 132 to 136 and bottom electrode layer 130 using the top electrodes 202, 204 and hard masks 206, 208 as a patterning stack. This etching process forms a first MTJ stack 302 and first bottom electrode 306 under the first top electrode 202 and a second MTJ stack 304 and second bottom electrode 308 under the second top electrode 204. During etching of the MTJ stack 302, 204 using IBE, the hard masks 206, 208 along with some portion of the top electrode 202, 204 may be etched away. The resulting structures comprising at least the top electrodes 202, 204; MTJ stacks 302, 304; and bottom electrodes 306,

308 are herein referred to as "magneto-resistive random access memory (MRAM) stacks/pillars 310, 312" and/or "memory devices 310, 312".

In some instances, etching of the MTJ stack layers 132 to 136 may undesirably etch the underlying dielectric cap layer 124 as illustrated in FIG. 3. Undesirable etching of the dielectric layer 124 may result in a significant or complete removal of the dielectric layer 124 in the open region (e.g., logic area 122) outside the memory array area 122 thereby exposing the patterned metal layers 112, 114 within the logic area 122. This is a significant concern for device and downstream processing due to patterned metal layer contamination. Dielectric gouging may be reduced by reducing IBE over etch and clean-up time. However, this process induces footing at the bottom electrodes 306, 308 and leaves metal residue on the MTJ sidewalls causing a junction short.

Figure 4:
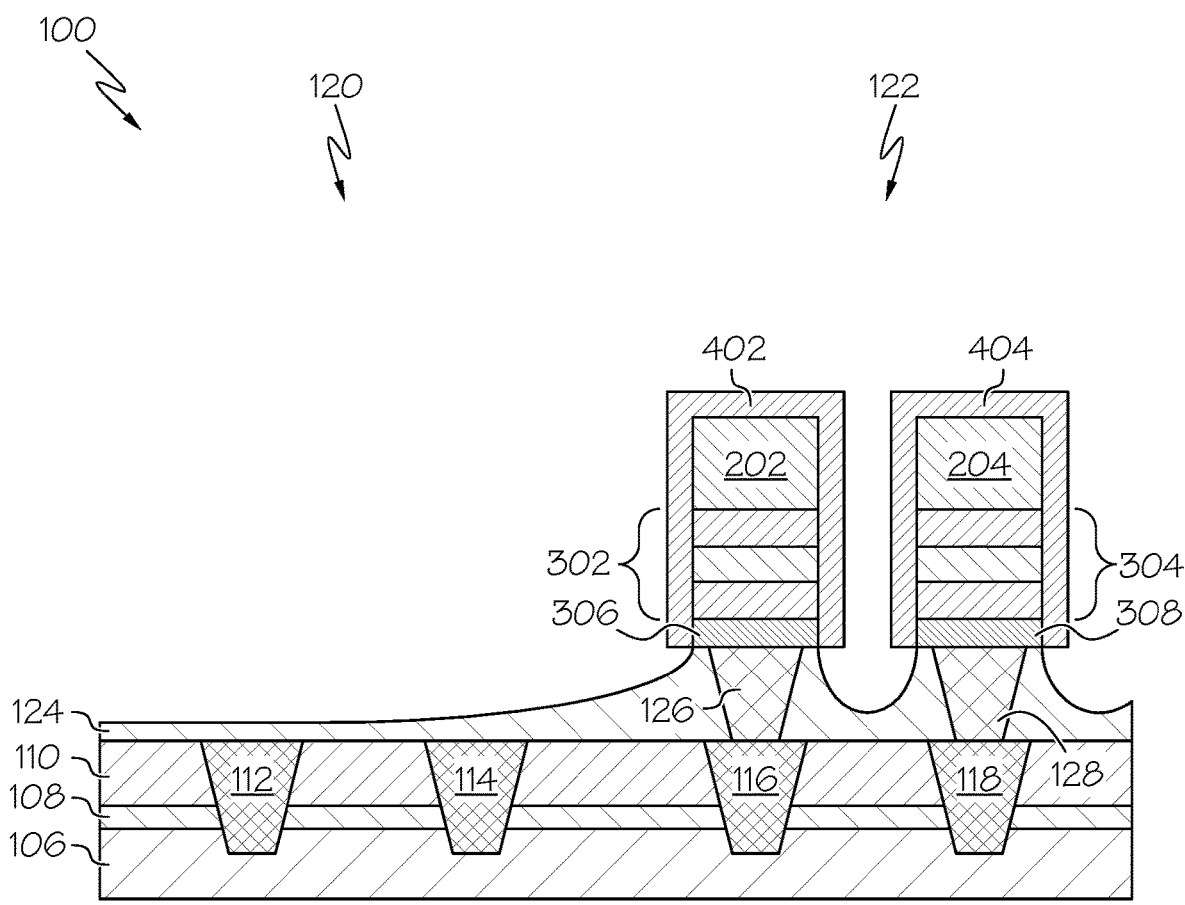
FIG. 4 is a cross-sectional view of the semiconductor device structure after a self-assembled monolayer has been selectively formed on magneto-resistive random access memory (MRAM) stack/pillars according to one embodiment of the present invention.

Embodiments of the present invention overcome these problems by replenishing the dielectric cap layer 124 utilizing selective deposition after the MTJ stack etching process. For example, FIG. 4 shows that a self-assembly monolayer (SAM) 402, 404 is formed on and in contact with each of the MRAM stacks 310, 312 using a selective grafting process. A self-assemble monolayer generally refers to a layer having a thickness approximately equal to a length of a molecule (but can typically have a carbon backbone of 6-18 carbon atoms). The layer of molecules attach (e.g., by a chemical bond) to a surface and adopted a preferred orientation with respect to that surface (and even with respect to each other).

A SAM may generally comprise an organized layer of amphiphilic molecules where one end of the molecule referred to as the "head group" shows a specific affinity for a substrate. The head group may be designed to chemically graft to one substrate depending on its surface chemistry. The head group may generally be connected to an alkyl chain in which a tail end can be functionalized. The molecules that form the SAM selectively attach to one material over another material and may prevent subsequent deposition on the attached material. This allows for selective deposition on materials not coated with the SAM.

In one or more embodiment, the SAM 402, 404 may be designed to selectively adhere to the metal surfaces of the MRAM stacks 310, 312 selective to the remaining dielectric cap layer 124 around the bottom electrode 306, 308 in the memory and logic areas 120, 122. For example, the SAM 402, 404 may comprise monolayer precursors not including silyl groups such as, for example, organic phosphonic acids that include at least a phosphonic acid group ($-PO_3H_2$) which bonds to a metal oxide surface. Examples of phosphonic acids include (but are not limited to) methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecylphosphonic acid, pentadecylphosphonic acid, hexadecylphosphonic acid, heptadecylphosphonic acid, octadecylphosphonic acid, and nonadecylphosphonic acid. The selective grafting process may be performed using spin coating followed by a post apply bake process.

Figure 5:
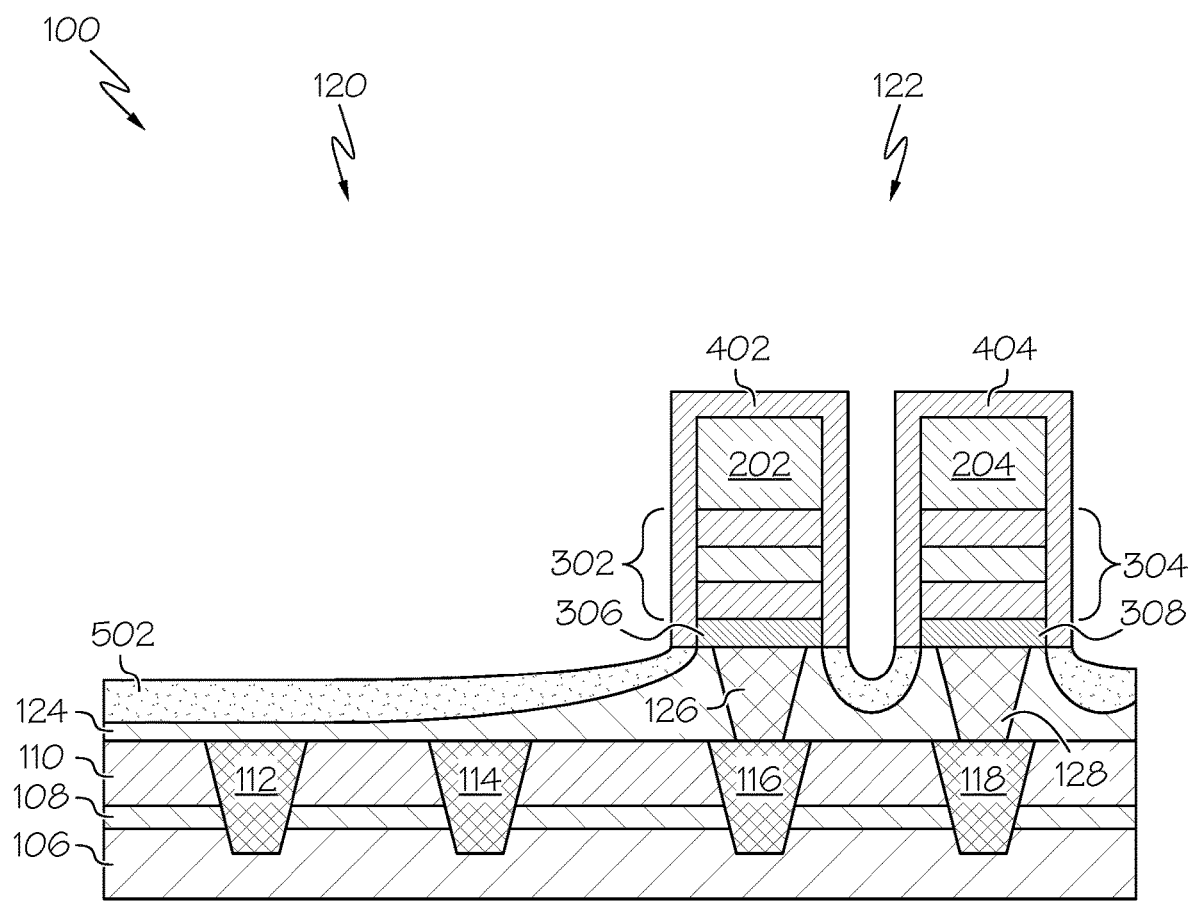
FIG. 5 is a cross-sectional view of the semiconductor device structure after a second dielectric cap layer has been formed on and in contact with a first dielectric cap layer according to one embodiment of the present invention.

As shown in FIG. 4, the SAM 402, 404 only adheres to the metal surfaces of the MRAM stacks 310, 312. A second cap dielectric layer 502 is then formed/deposited on the structure 100, as shown in FIG. 5. In this example, the second dielectric layer 502 is formed/deposited on and in contact with the remaining portions of the first dielectric cap layer 124 selective to the SAM covered MRAM stacks 310, 312. The second dielectric cap layer 502 may be deposited using a CVD or an ALD process, which allows the thickness of the second dielectric cap layer 502 independent of MRAM device patterning. In one embodiment, the second dielectric cap layer 502 may have a thickness that is greater than the thickness of the first dielectric cap layer 124 in at least the logic area 120. The thickness of second dielectric cap layer 502 may be between 50 nm to 150 nm, although other thicknesses are applicable as well. The second dielectric cap layer 502 may comprises materials such as (but not limited to) silicon carbonitride (SiCN:H), silicon carbide, hydrogen and nitrogen doped silicon carbide, silicon nitride, and/or the like.

The combination of the first and second dielectric layers 124, 502 forms a bi-layer dielectric cap The first and second dielectric cap layers 124, 502 may comprise the same material(s) or different material(s). In some embodiments, the second dielectric cap layer 502 has a lower dielectric constant than the first dielectric cap layer 124. Also, in some instances, portions of first dielectric cap layer 124 may be completely removed from the logic area 120 of the structure. In these situations, the second dielectric cap layer 502 may be formed on and in contact with the metallization stack 104 and the patterned metal layers 112, 114 within the logic area 120 of the structure 100.

Figure 6:
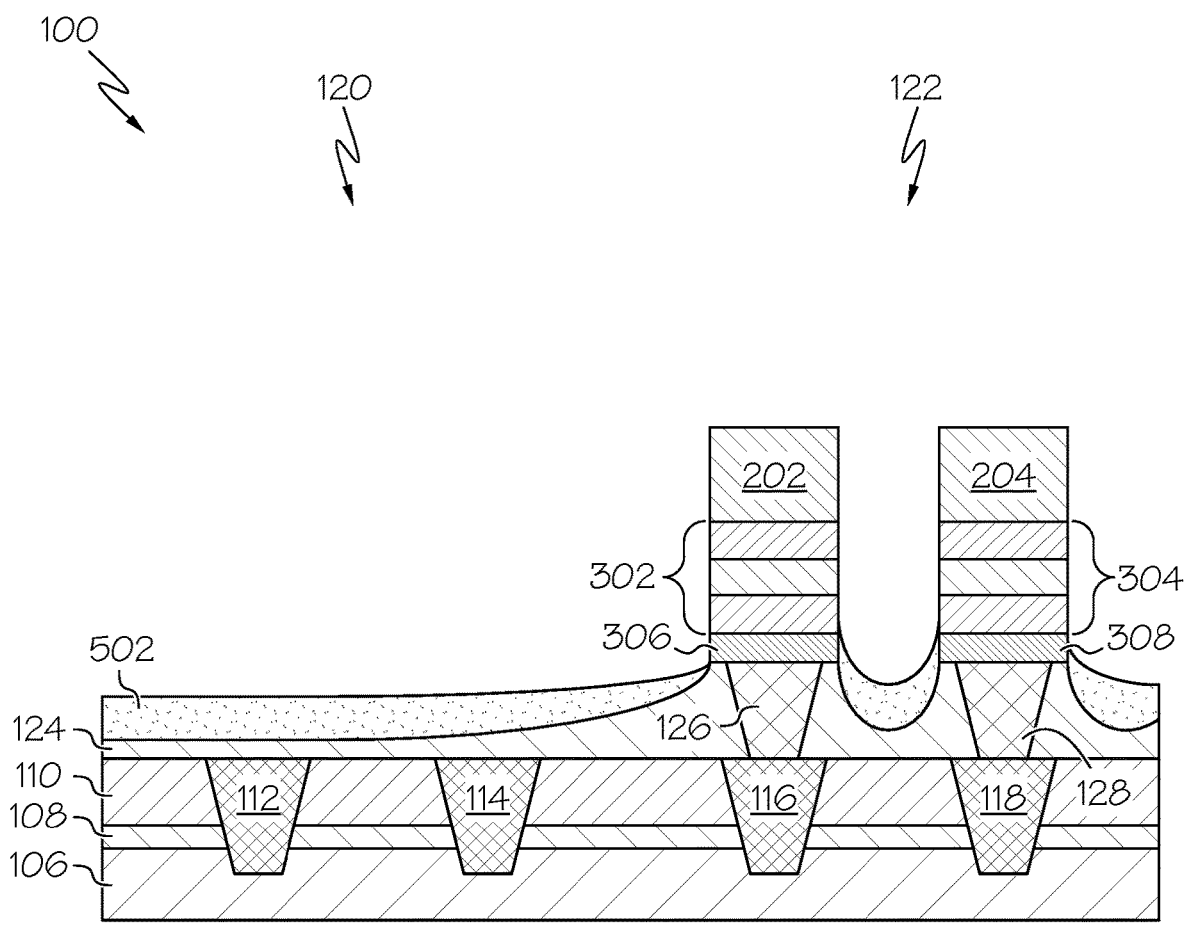
FIG. 6 is a cross-sectional view of the semiconductor device structure after the self-assembled monolayer has been removed according to one embodiment of the present invention.
Figure 7:
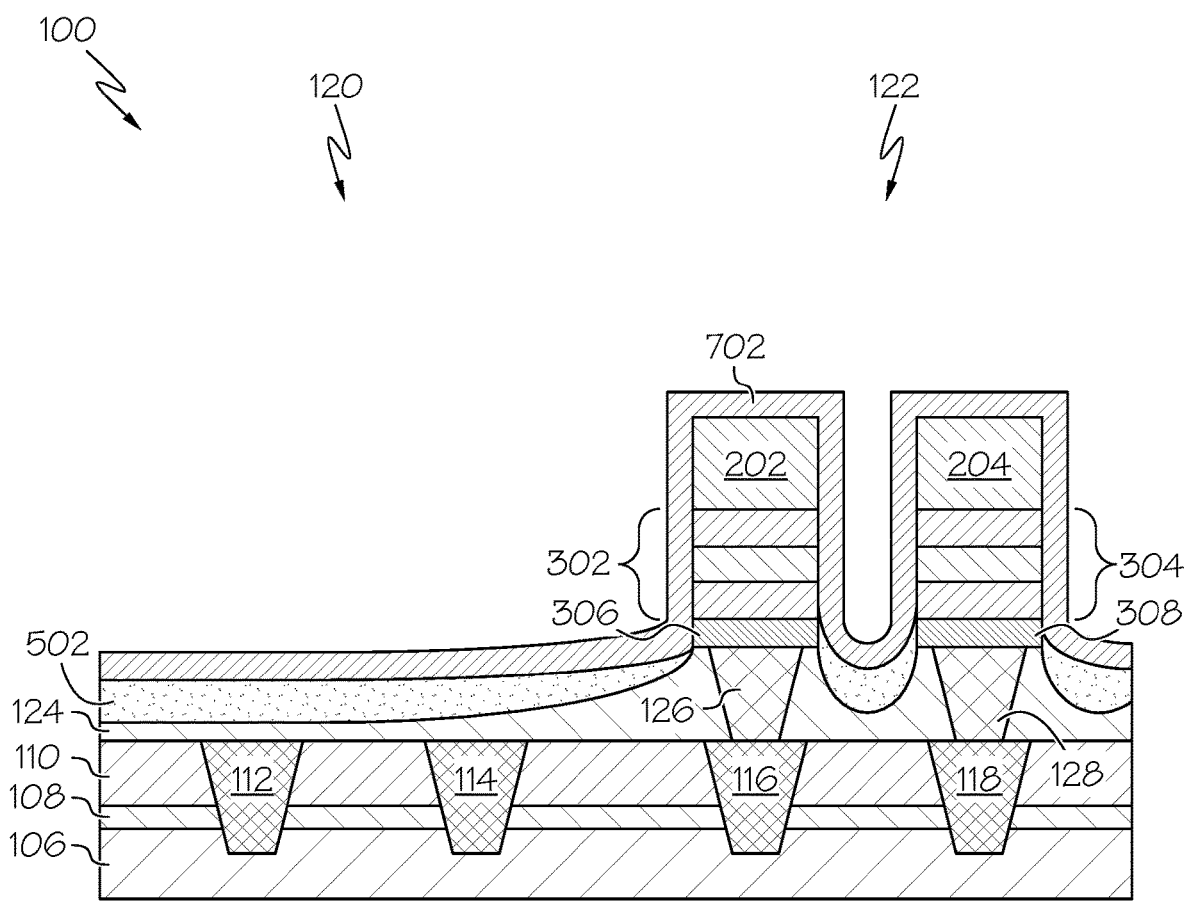
FIG. 7 is a cross-sectional view of the semiconductor device structure after an encapsulation layer has been formed over the structure according to one embodiment of the present invention.

After the second dielectric cap layer 502 has been formed, the SAM 402, 404 may be removed using, for example, a N2/H2 ashing process, as shown in FIG. 6. The exposed structures of the device are then encapsulated, as shown in FIG. 7. For example, an encapsulation layer 702 may be formed by depositing a dielectric material such as a silicon oxide, silicon nitride, silicon carbide and/or the like over and in contact with the top surface of the second dielectric cap layer 502, sidewalls of the bottom electrodes 306, 308; sidewalls of the MTJ stacks 302, 304; sidewalls of the top electrodes 202, 204; and a top surface of the top electrode 202, 204. The dielectric layer may be deposited using a passivation layer deposition process such as chemical vapor deposition (CVD), Plasma enhanced CVD (PECVD) and/or any other applicable process. The encapsulation layer 702 protects the memory device from degradation due to exposure to ambient oxygen and moisture as well as from any damages during later processing operations.

Figure 8:
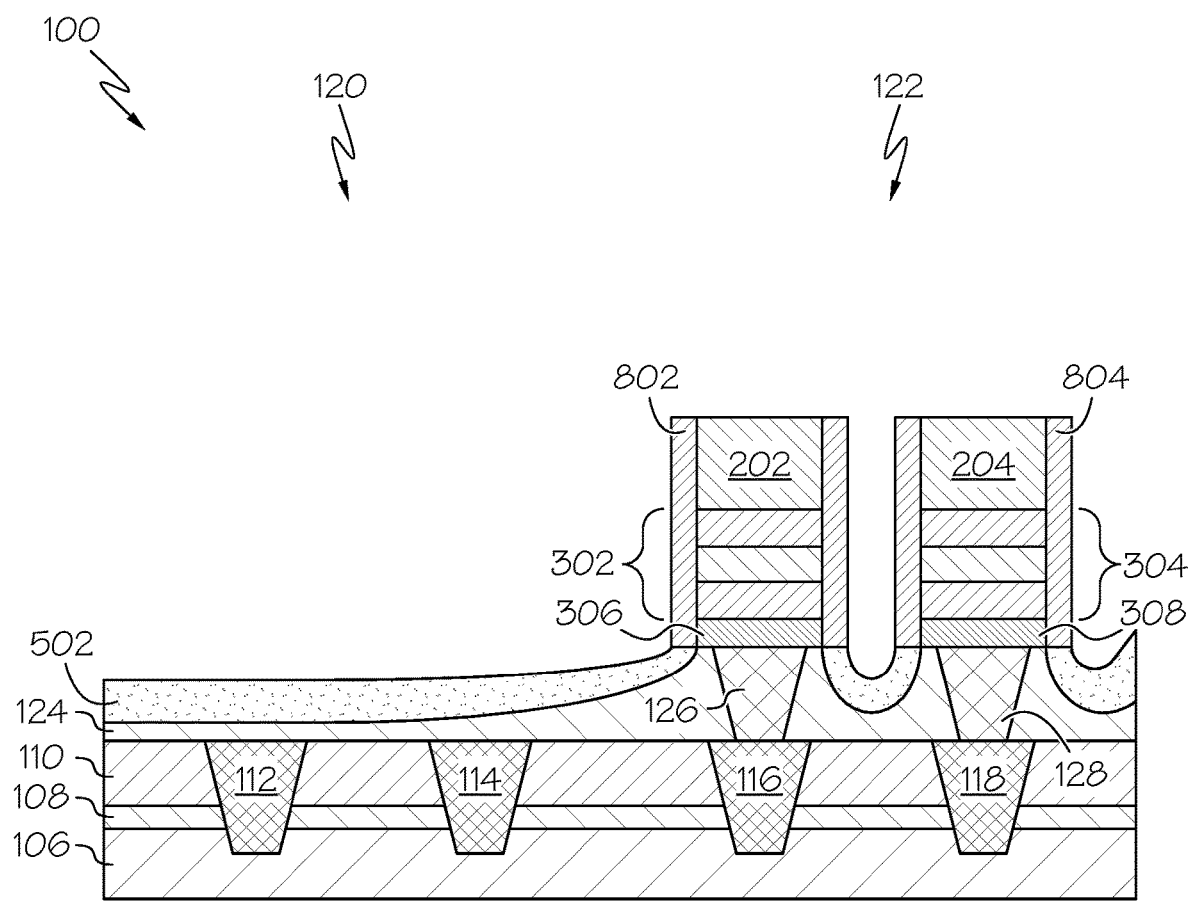
FIG. 8 is a cross-sectional view of the semiconductor device structure after the encapsulation layer has been etched back according to one embodiment of the present invention.

After the encapsulation layer 702 has been formed an etching process such as reactive ion etching (RIE) process may be performed to remove portions of the encapsulation layer 702 from horizontal surfaces of the structure 100, as shown in FIG. 8. For example, portions of the encapsulation layer 702 from the top surface of the second dielectric cap layer 502 and the top surface of the top electrodes 202, 204. This process forms a spacer 802, 804 on the sidewalls of the MTJ stacks 302, 304.

Figure 9:
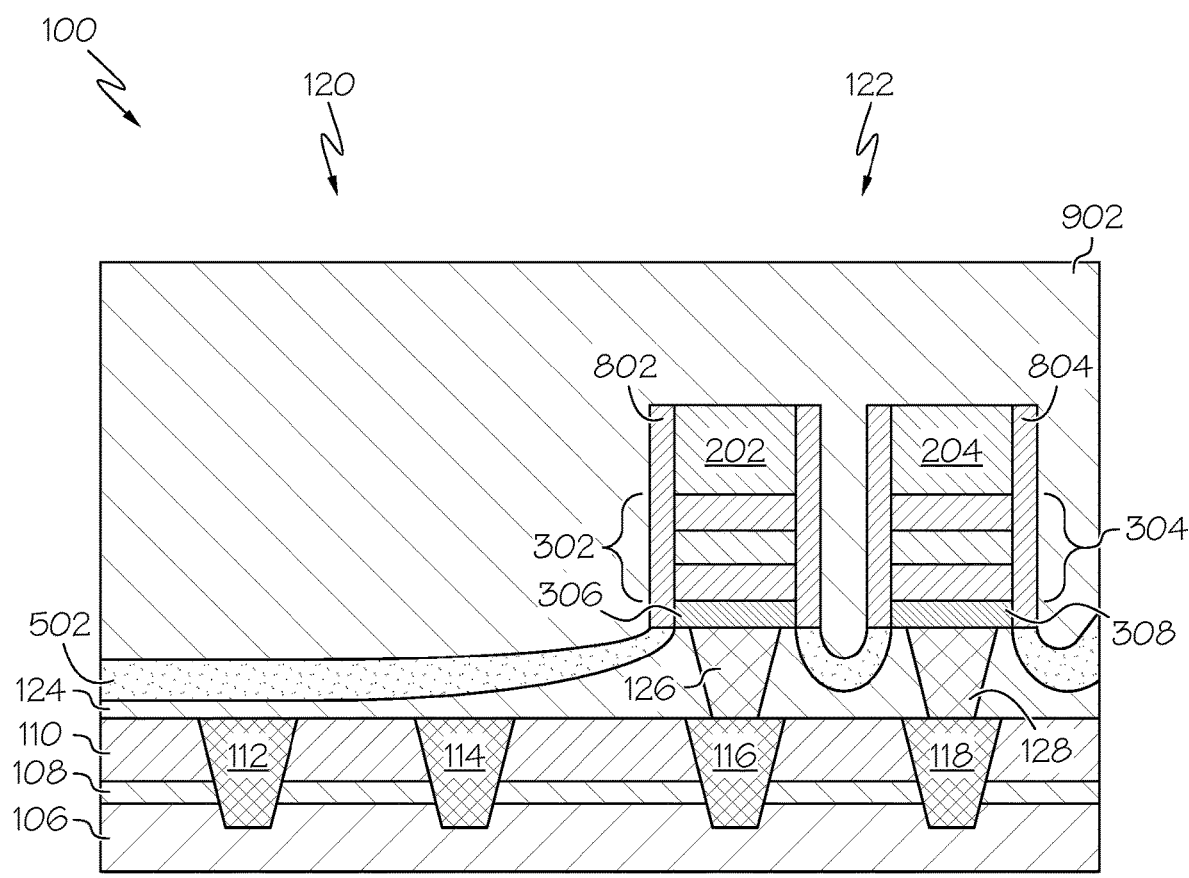
FIG. 9 is a cross-sectional view of the semiconductor device structure after an inter-layer dielectric has been deposited over the structure according to one embodiment of the present invention.
Figure 10:
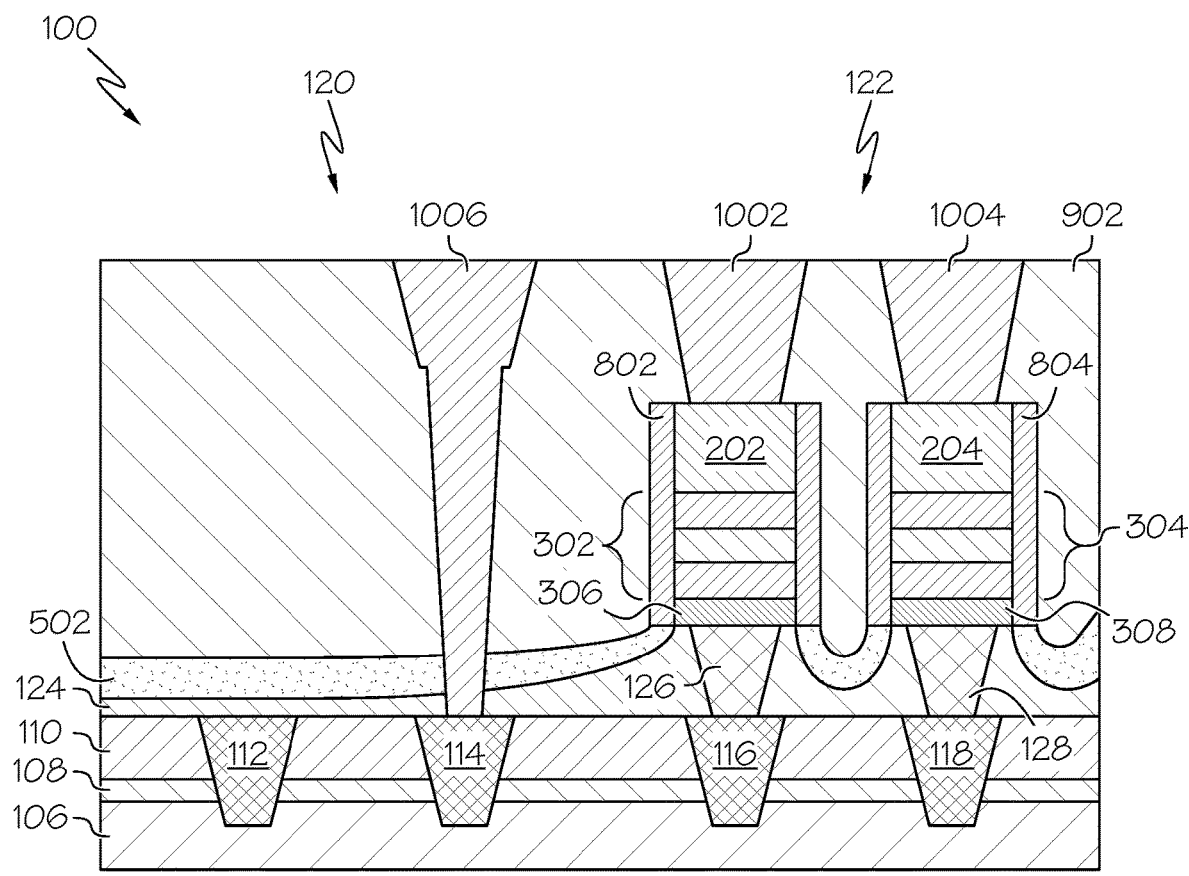
FIG. 10 is a cross-sectional view of the semiconductor device structure after top electrode contacts and one or more logic area contacts have been formed according to one embodiment of the present invention.

After formation of the spacers 802, 804, an inter-layer dielectric (ILD) layer 902 may be formed over the entire structure, as shown in FIG. 9. The ILD layer 902 may be formed using a deposition method, such as chemical vapor deposition (CVD), e.g., plasma enhanced chemical vapor deposition (PECVD), deposition from chemical solution, or spin on deposition. FIG. 10 shows that one or more top electrode contacts 1002, 1004 and one or more logic area contacts 1006 are formed within the ILD 902 utilizing, for example, a dual damascene process.

For example, a patterning stack may be formed on and in contact with the ILD 902. The stack may comprise multiple hardmask layers such as sacrificial nitride, titanium nitride, oxide, and/or the like. The stack may also comprise a tri-layer or quad layer lithography stacks. For example, the stack may comprise an OPL, an ARC layer, and a photoresist layer similar to those discussed above with respect to FIG. 1. The photoresist layer may be patterned using any suitable photolithography technique similar to the processes discussed above with respect to FIG. 1. The patterning process forms one or more trenches for the contacts/interconnects within the ILD 902. A first set of the trenches 1002, 1004 exposes at least a portion of the top surface of the top electrodes 302, 304 while a second set of the trenches with via 1006 exposes at least a portion of the top surface of one or more of the patterned metal layers 114 within the logic area 120.

A metal fill process may then be performed to fill the trenches to form one or more contacts/interconnects 1002 to 1006. For example, a barrier liner such as TaN, TiN, Ru may be formed using CVD or ALD process, a copper seed may be deposited via PVD followed by copper plating, though chemical vapor deposition (CVD) techniques could be used as well. However, other materials and processes may be utilized to form the 902. For example, copper, cobalt, tungsten, aluminum, a combination thereof, and other the like may be used to fill the trenches. The metal may be planarized such that the top surface of the contacts/interconnects 1002 to 1006 is planar with the top surface of the ILD 902.

The resulting structure 100, in one embodiment, comprises first and second dielectric capping layers 124, 502 that form a dielectric encapsulation surrounding the MRAM stacks 310, 312 without any flaring of the bottom electrode 306, 308. In addition, the interface between the MTJ stacks 302, 304 and the dielectric spacers 802, 804 is free of any metal residue. A bilayer dielectric cap 124, 502 is formed around the bottom electrodes 306, 308. In some embodiments, the second dielectric cap layer 502 may have a lower dielectric constant than the first (underlying) dielectric cap layer 124. In addition, the first dielectric cap layer 124 may be recessed in both the logic and memory areas 120, 122 of the structure where, in some embodiments, only the second dielectric cap layer 502 may be disposed in the more open logic area 120.

Figure 11:
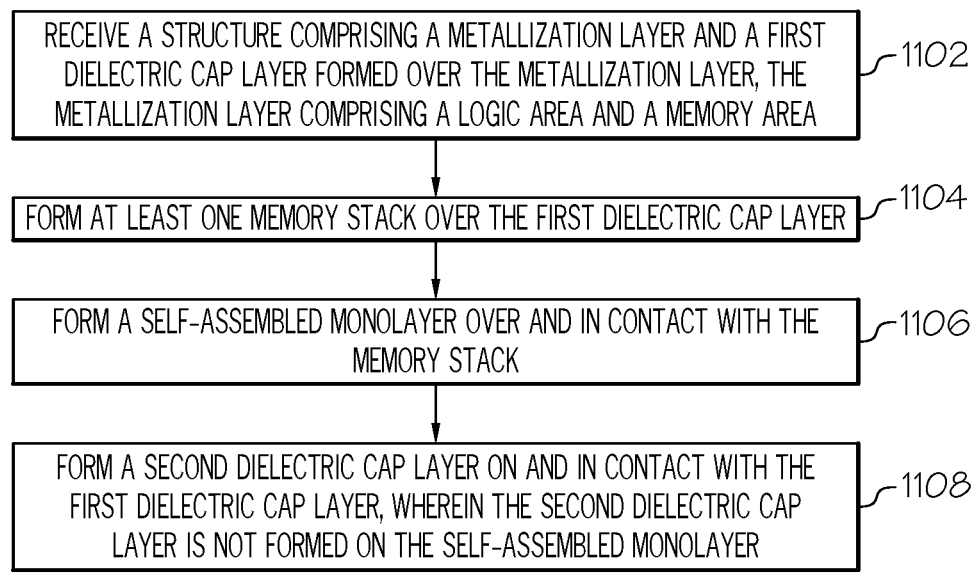
FIG. 11 is an operational flow diagram illustrating one example of a process for forming embedded memory devices utilizing a self-assembled monolayer according to one embodiment of the present invention.

FIG. 11 is an operational flow diagram illustrating one example of a process for forming an embedded memory device utilizing a self-assembled monolayer according to one embodiment of the present invention. It should be noted that each of the steps shown in FIG. 11 has been discussed in greater detail above with respect to FIGS. 1 to 10. A structure is received, at step 1102. The structure comprises a metallization layer and a first dielectric cap layer formed over the metallization layer. The metallization layer comprises a logic area and a memory area. At least one memory stack is formed over the first dielectric cap layer, at step 1104. A self-assembled monolayer is formed over and in contact with the memory stack, at step 1106. A second dielectric cap layer is formed on and in contact with the first dielectric cap layer, at step 1108. The second dielectric cap layer is not formed on the self-assembled monolayer.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method for forming an embedded memory device, the method comprising:
receiving a structure comprising a metallization layer and a first dielectric cap layer formed over the metallization layer, the structure comprising a logic area and a memory area;
forming at least one memory stack over the first dielectric cap layer;
forming a self-assembled monolayer over and in contact with the at least one memory stack; and
forming a second dielectric cap layer on and in contact with the first dielectric cap layer, wherein the second dielectric cap layer is not formed on the self-assembled monolayer.

2. The method of claim 1, further comprising:
removing the self-assembled monolayer after forming the second dielectric cap layer; and
forming an encapsulation layer on sidewalls of the at least one memory stack.

3. The method of claim 2, further comprising:
forming an inter-layer dielectric over the second dielectric cap layer and the at least one memory stack; and
forming a contact within the inter-layer dielectric and in contact with a top electrode of the at least one memory stack.

4. The method of claim 3, further comprising:
forming a contact within the inter-layer dielectric and in contact with a patterned metal layer disposed within a portion of the metallization layer within the logic area of the structure.

5. The method of claim 1, wherein forming the at least one memory stack over the first dielectric cap layer comprises:
forming a bottom electrode layer on the first dielectric cap layer;
forming a stack of magnetic tunnel layers on the bottom electrode layer; and
forming a top electrode layer on the stack of magnetic tunnel layers.

6. The method of claim 5, wherein forming the at least one memory stack over the first dielectric cap layer comprises forming a hardmask layer on the top electrode layer.

7. The method of claim 5, wherein forming the at least one memory stack over the first dielectric cap layer comprises patterning at least the top electrode layer, the stack of magnetic tunnel layers, and the bottom electrode layer to form the at least one memory stack.

8. The method of claim 1, wherein a portion of the first dielectric cap layer is etched during forming of the at least one memory stack.

* * * * *